(12) United States Patent
Neumann et al.

(10) Patent No.: US 11,178,769 B2
(45) Date of Patent: Nov. 16, 2021

(54) DATALOGGERS IN COMPACT DESIGN

(71) Applicant: ELPRO-BUCHS AG, Buchs (CH)

(72) Inventors: Dirk Neumann, Bad Ragaz (CH); Beat Rudolf, Igis (CH)

(73) Assignee: ELPRO-BUCHS AG, Buchs (CH)

( * ) Notice: Subject to any disclaimer, the term of this patent is extended or adjusted under 35 U.S.C. 154(b) by 0 days.

(21) Appl. No.: 16/351,601

(22) Filed: Mar. 13, 2019

(65) Prior Publication Data

US 2019/0289719 A1 Sep. 19, 2019

(30) Foreign Application Priority Data

Mar. 13, 2018 (CH) ..................... 00320/18

(51) Int. Cl.
| | |
|---|---|
| *G01D 9/00* | (2006.01) |
| *H05K 5/02* | (2006.01) |
| *H05K 1/18* | (2006.01) |
| *H04Q 9/00* | (2006.01) |
| *H05K 1/11* | (2006.01) |
| *H05K 5/00* | (2006.01) |
| *H05K 7/14* | (2006.01) |

(52) U.S. Cl.
CPC ............... *H05K 1/18* (2013.01); *G01D 9/005* (2013.01); *H04Q 9/00* (2013.01); *H05K 1/11* (2013.01); *H05K 5/0017* (2013.01); *H05K 7/1427* (2013.01); *H04Q 2209/40* (2013.01); *H05K 2201/10037* (2013.01); *H05K 2201/10128* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 6,570,508 B1* | 5/2003 | Kvenvold | .............. | G06F 1/1626 340/870.16 |
| 7,190,278 B2* | 3/2007 | Morrison | .................. | G01C 9/06 340/545.5 |
| 2009/0017778 A1* | 1/2009 | Akieda | ............... | H04M 1/0262 455/90.3 |
| 2012/0251864 A1* | 10/2012 | Blaha | ..................... | H05K 3/301 429/100 |
| 2014/0225747 A1* | 8/2014 | Abts | ........................ | H04Q 9/00 340/870.11 |
| 2015/0085903 A1* | 3/2015 | Gundel | ..................... | H05K 1/18 375/219 |
| 2017/0160111 A1* | 6/2017 | Dowdall | .............. | G01N 33/383 |
| 2018/0177061 A1* | 6/2018 | Ganton | .................. | H05K 1/147 |

* cited by examiner

*Primary Examiner* — Srilakshmi K Kumar
*Assistant Examiner* — Jerold B Murphy
(74) *Attorney, Agent, or Firm* — Buchanan Ingersoll & Rooney PC

(57) ABSTRACT

A data logger is disclosed as having functional units, arranged inside a housing, for detecting, digitizing, optionally storing and optionally evaluating measurement data and for transmitting data to an external data processing device, and a power source, such as a button cell battery, arranged inside the housing. The functional units for detecting, digitizing, optionally storing and optionally evaluating measurement data and for transmitting data to an external data processing device are arranged on a printed circuit board, which forms a component of the housing of the data logger. The housing of the data logger forms at the same time the housing of the power source, whereby at least one electrical contact for the power source is provided on the housing.

20 Claims, 2 Drawing Sheets

DATALOGGERS IN COMPACT DESIGN

RELATED APPLICATION

This application claims priority under 35 U.S.C. § 119 to Swiss Patent Application No. 00320/18 filed in Switzerland on Mar. 13, 2018, the entire content of which is hereby incorporated by reference in its entirety.

FIELD

The present disclosure relates to a data logger in a compact design.

BACKGROUND INFORMATION

Data loggers are used when, for example, a long-term recording of measurement parameters is to be performed, without supervision personnel having to be constantly present on site. Thus, data loggers are primarily used in field trials, in monitoring shipping, such as, in monitoring acceleration, vibration and climate values in truck or rail shipping, in recording moisture and temperature values during shipping and in warehouses, in the pharmaceutical and food industries, in fault analysis of systems, for example for detecting voltage fluctuations in or on a system, for monitoring and notification in production processes, and in quality studies, in research, development, and in design. Even in the hobby realm, for example in model airplanes, data loggers are used to record and monitor measurement data. Data loggers in which no recording of measurement values is carried out are also known. Such devices are also frequently referred to as indicators, since their tasks primarily consist in displaying infringements of the boundary values of the monitored measurement variables. Because of the great similarity to the devices with measurement value storage, indicators in the following application, however, are not cited separately but rather are encompassed by the collective term data logger.

The measurement data acquired and stored over an extended period can, if necessary, or desired, be further processed, depicted graphically, and evaluated statistically for documentation. In addition to the measurement data, data loggers frequently also acquire various pre-defined events, such as a battery replacement, user intervention, or the change of a memory card, which take place during a monitoring period in the device. Thus, such data loggers are to meet, for example, important criterion of the pharmaceutical, food and chemical industry, which is commonly known as the Audit Trail. The measurement data acquired by the data logger and the data for the Audit Trail are filed in an internal storage unit. To evaluate all data, the data logger can be connected via cable to a data-processing unit, such as, a PC, in order to read the data. Reading the data can also be done via a wired or else a wireless LAN or similar connection. Data loggers that make possible a data transfer via WiFi technology, Bluetooth or NFC technology to smartphones or tablet computers are also already known. After reading the data, the latter can be processed with a device-specific evaluation software in order to depict them in the form of tables or graphics and to create documents or reports. These known data loggers have a relatively complex structure and can involve corresponding wired or wireless interfaces for reading or for transmission of measurement data.

Some known data loggers are equipped with a screen display, which can make possible a direct depiction and display of measurement data and in-hardware evaluations. Other known data loggers have one or more LEDs, with which the system status can be displayed. The LEDs can be used in some of the known data loggers even for a display of boundary value violations of one or more monitored parameters. With the aid of such data loggers, for example, the expiration date of a product can also be monitored and can be displayed by an LED when it is exceeded.

There can be a desire to apply a data logger directly to the product that is to be monitored, for example to a box of medicine or the like. For example, in this case, they are to have an overall height that is as short as possible so that a high packing density is ensured. Achieving such a compact design is not trivial, since data loggers have diverse functional units for detecting, digitizing, optionally storing and optionally evaluating measurement data and for transmitting data to an external data processing device. The electronic components that are used for this purpose have been arranged on a printed circuit board or board. For the operation of the data logger, the latter must be equipped with a power source, such as with a battery or a storage battery. The printed circuit board that is provided with the electronic components and strip conductors and the power source, for example a button cell battery, are arranged within a housing in order to protect it from mechanical damage. The power source in this case can be arranged in a separate battery housing.

The arrangement of all components of the data logger within a stable housing can lead to a device with a relatively tall overall height. Moreover, in the known data loggers, the arrangement of the electronic components and the power source, for example a button cell battery, still always calls for a significant portion of manual labor, for example to insert the power source into its separate housing and to connect it electrically to the board.

SUMMARY

A data logger is disclosed comprising: functional units, arranged inside a housing, for detecting, digitizing, optionally storing and optionally evaluating measurement data and for transmitting data to an external data processing device; a power source arranged inside the housing, wherein the functional units for detecting, digitizing, optionally storing and optionally evaluating measurement data and for transmitting data to an external data processing device are arranged on a printed circuit board, which forms a component of the housing of the data logger, the housing of the data logger forming the housing of the power source; and at least one electrical contact for the power source provided on the housing.

BRIEF DESCRIPTION OF THE DRAWINGS

Additional advantages and features are produced from the subsequent description of exemplary variant embodiments of the invention, with reference to the diagrammatic drawings. Here, there are shown in depictions that are not true to scale.

DETAILED DESCRIPTION

Figure 1:
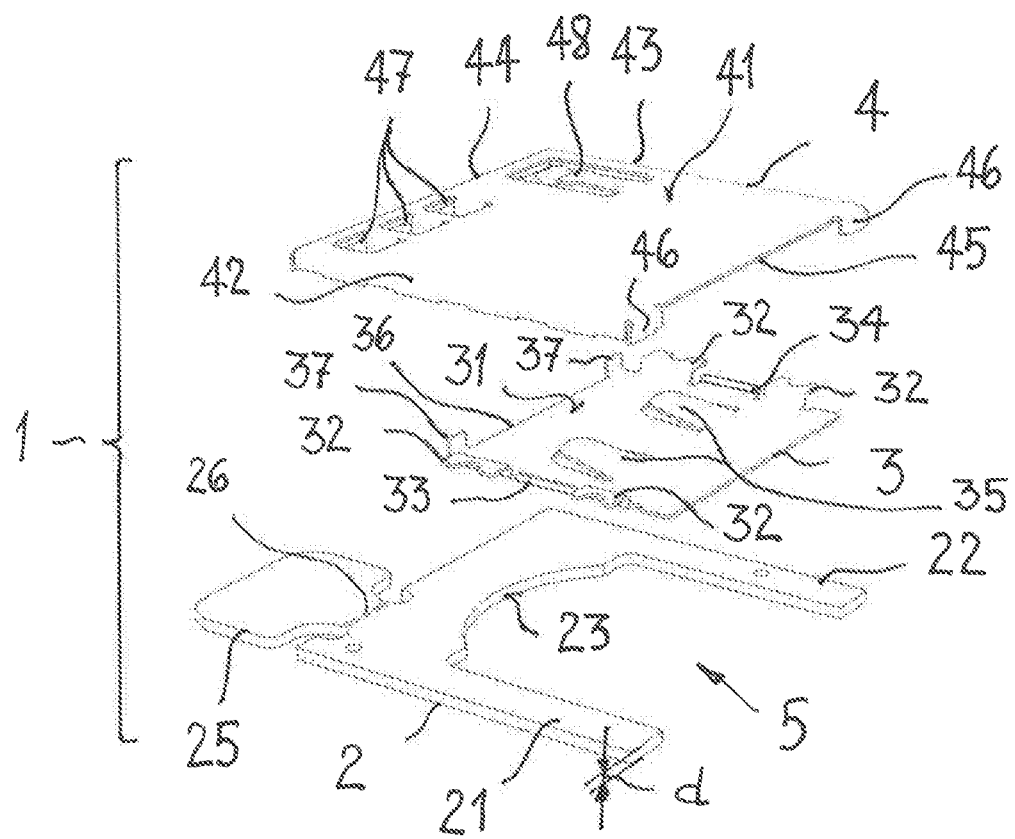
FIG. 1 is an exploded depiction of an exemplary embodiment of a data logger according to the present disclosure.

A data logger is disclosed that has a compact design and that has in particular a shorter overall height than the known data loggers. In this case, the structure of the data logger is to promote a largely automated assembly. Manual equipping and contacting labor can be eliminated to a large extent.

An exemplary data logger as disclosed includes functional units arranged inside a housing for detecting, digitizing, optionally storing and optionally evaluating measurement data and for transmitting data to an external data processing device, and includes a power source, in particular a battery or a storage battery, arranged inside the housing. The functional units for detecting, digitizing, optionally storing and optionally evaluating measurement data and for transmitting data to an external data processing device are arranged on a printed circuit board, which forms a component of the housing of the data logger. The housing of the data logger forms at the same time the housing of the power source, whereby at least one electrical contact for the power source is made on the housing.

In exemplary embodiments, the board that is equipped with the components forms an essential component of the housing of the data logger and is already produced in an automated SMT process. Thus, the board that is equipped with the electronic components forms an essential component of the housing. Unlike known data loggers, exemplary embodiments of a data logger as disclosed do not have a separate housing for the power source, such as a button cell battery. Rather, the housing of the data logger simultaneously forms the housing for the button cell battery. The electrical contacts for the button cell battery are already integrated into the housing.

The overall height of the data logger can be further reduced by configurations disclosed herein. The number of components of the data logger is simultaneously reduced; for example, the separate battery housing is no longer necessary. The electrical contacts for the power source are already made integrally on the housing of the data logger. As a result, the usual manual soldering of contact sheets is no longer necessary. Because of the special configuration and arrangement of the individual components, accommodations for an automated production are provided.

At least one first electrical contact surface for the power source is arranged on the printed circuit board, while a second electrical contact for the power source is formed by an inner side of a housing cover facing the printed circuit board. The housing cover can be connected to the printed circuit board. The connection in this case can be a positive connection or else can be carried out simply by gluing, soldering or pressing. The data logger includes (e.g., consists essentially only of) the housing cover, the printed circuit board equipped with electronic components with the at least one first electrical contact, and the power source, usually a button cell battery.

An especially low overall height of the data logger can be produced when the printed circuit board is provided with a recess, into which a holding part for the power source is inserted, which has the at least one first electrical contact for the power source. The holding part has an exterior surface that extends flush into a rear side of the printed circuit board and is aligned with the latter. Because of the selected design, the first electrical contact is not mounted on the printed circuit board but rather can be recessed in the latter. In this way, the overall height of the data logger is reduced by almost the entire thickness of the printed circuit board. In an exemplary variant embodiment of the data logger, the recess in the printed circuit board can be designed and configured as a flat cutaway. The holding part is inserted into the recess and connects the two flat extensions of the printed circuit board resulting therefrom and is supported on the latter.

In order to ensure a good support of the power source, such as a button cell battery, held between the holding part inserted into the printed circuit board and the housing cover, a face of the cutaway in the printed circuit board encompassed by the flat extensions is designed and configured as a support surface for the button cell battery. To this end, the face has—at least in places—a contour that is curved corresponding to the circumferential geometry of the button cell battery.

In a suitable exemplary variant embodiment that can be produced economically, the housing cover and the holding part are in each case made as punched and folded parts from an electrically conductive metal sheet.

A data logger according to the present disclosure can be designed and configured for reading via a USB connection or else for wireless reading, such as, for example, via Bluetooth, ZigBee, WLAN or NFC. In the latter case, the functional units that are arranged inside the housing can also include a unit for wireless data transmission.

A variant exemplary embodiment of the data logger can provide that the unit for the wireless data transmission be equipped with a display system that emits electromagnetic radiation, which system is visible from the outside or is mounted inside the housing. The display system that emits an electromagnetic radiation can lie in the visible wavelength spectrum from, for example, approximately 380 nm up to approximately 780 nm for an emission of light, or it can be infrared radiation from approximately 780 nm up to 1 μm. Also, combined emissions of visible radiation and infrared radiation are possible.

In another exemplary variant embodiment of the data logger, the display system that emits electromagnetic radiation includes at least one light-emitting diode, which for example, is arranged on the printed circuit board. The at least one light-emitting diode can be arranged on a front end side of the printed circuit board. The data logger then has an opening or recess at the corresponding position on the narrow side of the housing, through which opening or recess the light-emitting diode can release its radiation.

In another exemplary variant embodiment, the at least one light-emitting diode is arranged on the printed circuit board. In a top surface of the housing cover, a window is then recessed at a position that corresponds to the arrangement of the at least one light-emitting diode on the printed circuit board. The light-emitting diode can be designed and configured for, for example, a multi-colored display. The window can be made by, for example, punching an opening in the housing cover.

In an exemplary variant embodiment of the data logger with multiple light-emitting diodes, a number of corresponding windows can be made on the housing cover, which number corresponds to the number of light-emitting diodes on the printed circuit board. In an alternative exemplary variant embodiment, multiple light-emitting diodes can also be arranged tightly beside one another below a window in the housing cover.

In an exemplary variant embodiment of the data logger, the latter can have a light-emitting diode, which is provided both for a display of the operating status and for data transmission. Another exemplary variant embodiment of the data logger can provide that in addition to at least one light-emitting diode for the display of the operating status, at least one other light-emitting diode is provided, which is used only for data transmission. The at least one additional light-emitting diode can be selected to be optimized with respect to its function of data transmission. In this way, the rate of data transmission is increased and optimized.

In another exemplary embodiment of the data logger, a movable tongue can also be made in the top surface of the housing cover, which tongue interacts with an actuating button, which is arranged on the printed circuit board. Depending on the embodiment of the data logger, various modi of the data logger, for example on/off, measurement mode, transmission mode, can be selected via the buttons.

In an exemplary variant embodiment of the data logger, the functional unit for data transmission is designed and configured for a time- and/or intensity-controlled modulation of the display system that emits electromagnetic radiation. The data can be measured raw data and/or also results of the already evaluated measurement data. Complete data sets can be transmitted or else only extracts from the data. The coded transmitted data can be acquired and recorded directly by an external data processing device, by its photographic detection system recording static and/or dynamic light patterns produced by the display system that emits electromagnetic radiation and being stored in a storage unit of the data processing device for further processing.

The functional unit for data transmission can be designed and configured for a time- and/or intensity-controlled modulation of the display system that emits electromagnetic radiation. In this case, this can be a digital phase modulation, which can be implemented, for example, according to a one- or multi-dimensional Manchester Code. The Manchester Code is used in this case in order to transmit data and clock rates simultaneously. In exemplary embodiments, the transmission of the clock rates is necessary since the photographic detection systems are operated on the portable data processing device generally asynchronously to the clock of the display system that emits electromagnetic radiation, in particular the static and/or dynamic light patterns delivered by the light-emitting diodes.

In accordance with exemplary embodiments, the term Manchester Code is also defined as the protocol of a differential Manchester Code. A multi-dimensional Manchester Code is used when the data transmission is carried out via, for example, multiple parallel operable light-emitting diodes or similar display systems, whereby of all light-emitting diodes, always only at least one light-emitting diode changes its status from one brightness value to the next. In this case, the modulation can be carried out digitally via an activation or deactivation of the respective light-emitting diode. In a further exemplary variant embodiment, the light-emitting diodes can also be operated at graduated brightness levels.

The data transmission by electromagnetic radiation is carried out onto an external data processing device. In this case, this can be a stationary device or a portable device. In an exemplary variant embodiment of the data logger, the display system that emits electromagnetic radiation, light and/or infrared radiation, which is controlled by the functional unit for data transmission, can, for example, be designed and configured for a visual, unidirectional communication with a smartphone, a notebook or a tablet computer. The smartphone, the notebook or the tablet computer can have a camera for visual recording of static and/or dynamic light patterns. To acquire and to process the transmitted data, they can be equipped with an application for decoding and further processing of data transmitted by the light-emitting display system. In this case, the functional unit for data transmission can be designed and configured with any operating system to transmit data to a smartphone, to a notebook or to a tablet computer. For example, the smartphone or the tablet computer can be equipped with an operating system which is selected from the group that includes (e.g., consists of) Android, iOS, Windows Phone and Blackberry OS.

Smartphones, notebooks and tablet computers are now widely available. They are and will be equipped with cameras of ever greater quality, so that detection of data that are transmitted via electromagnetic radiation, in particular visible light, or a display system that emits infrared radiation, for example light-emitting diodes, can be done very quickly and reliably. The detection and recording of the transmitted data can be done independently of the type of smartphone, notebook or tablet computer and operating system thereof.

The electromagnetic emitting display system that is controlled by the functional unit for data transmission can also be designed and configured for unidirectional communication with an embedded computer system. An embedded computer system is in this case defined as a data processing device that unlike personal computers is not equipped with the usual peripheral devices, such as buttons, computer mice or hard disks, but rather uses special peripheral equipment, such as functional buttons, rotary switches, etc. An embedded computer system can be designed and configured for quite specific tasks and therefore can involve only minimal effort in hardware and software. The processor is designed and configured only for performing the specific task and can be, for example, a Field Programmable Gate Array (FPGA) or a special Application-Specific Integrated Circuit (ASIC). As a result, the power consumption of the embedded computer system can be kept very low. An embedded computer system often does not even require a separate operating system or gets by with specially reduced versions of standard operating systems. Application-specific programs, which are designed and configured as so-called embedded software, can be optimized with respect to their function and can be distinguished by a very stable program flow.

The perspective exploded depiction in FIG. 1 shows the components of an exemplary embodiment of a data logger, which is designated overall with reference number 1. The components of the data logger 1 include a printed circuit board or board 2, a holding part 3 for a power source, for example a button cell battery, and a housing cover 4. For purposes of better clarity, the depiction of the electronic components and strip conductors arranged on the printed circuit board 2 was omitted. The latter are also not essential for the mechanical design of the data logger. Likewise, in FIG. 1, the depiction of a power source, such as a button cell battery, arranged inside the data logger 1, was omitted.

The printed circuit board 2 or board is designed and configured flat and has an overall height d of for example, approximately 0.8 m to 1 mm. A recess 5 in the printed circuit board 2 is delimited by two flat extensions 21, 22 of the printed circuit board 2. A face 23 of the printed circuit board 2 that results from the recess 5 has a curved shape following a circular arc at least in places and thus follows the outside contour of a button cell battery, which can be used as a power source in the data logger 1 and has a circular cross-section.

The holding part 3 is a punched and bended part, designed flat, made from an electrically conductive metal sheet. The holding part 3 that is designed flat is made as an insert in the recess 5 of the printed circuit board 2. For this purpose it has four straps 32, which are arranged in pairs on wide sides 33, 34 of the holding part 3 and are formed so as to be raised via an upper side 31 of the holding part and extend over the wide sides 33, 34. The height of the straps 32 facing the upper side 31 of the holding part 3 can correspond approximately to the overall height d of the printed circuit board 2. The straps 32 serve as a support for the holding part 3 on the flat extensions 21, 22 of the printed circuit board 2 when the holding part 3 is inserted into the recess 5, and for creating electrical connections with corresponding contacts on the extensions 21, 22. For example, two first electrical contacts 35, which extend facing the upper side 31 of the holding part 3 and have a specific spring action, are made on the holding part. The holding part 3 can also have two more extensions 37 on one of its longitudinal sides 36, which extensions extend approximately vertically facing the upper side 31 of the holding part 3. The extensions 37 have a length 1, which can correspond approximately to the overall height d of the printed circuit board 2 or slightly exceeds the latter. The extensions 37 are used to support the holding part 3 on the front end face 23 that is formed by the recess 5 in the printed circuit board 2.

The housing cover 4 is a punched and bended part that can be made from an electrically conductive metal sheet. The housing cover 4 has folded wide sides 42, 43 extending from a top surface 41 and a folded longitudinal side 44. An opposite second longitudinal side 45 can also be formed bevelled over its entire longitudinal extension. As an alternative, folded guides 46 can be formed on the two ends of the second longitudinal side 45, as depicted by way of example. The folded wide sides 42, 43, the folded longitudinal side 44, and the folded guides 46 support the housing cover 4 in the assembled state at the printed circuit board 2 and on the flat extensions 21, 22 of the printed circuit board 2 and create electrical connections to correspondingly designed and configured contacts on the printed circuit board 2.

Figure 2:
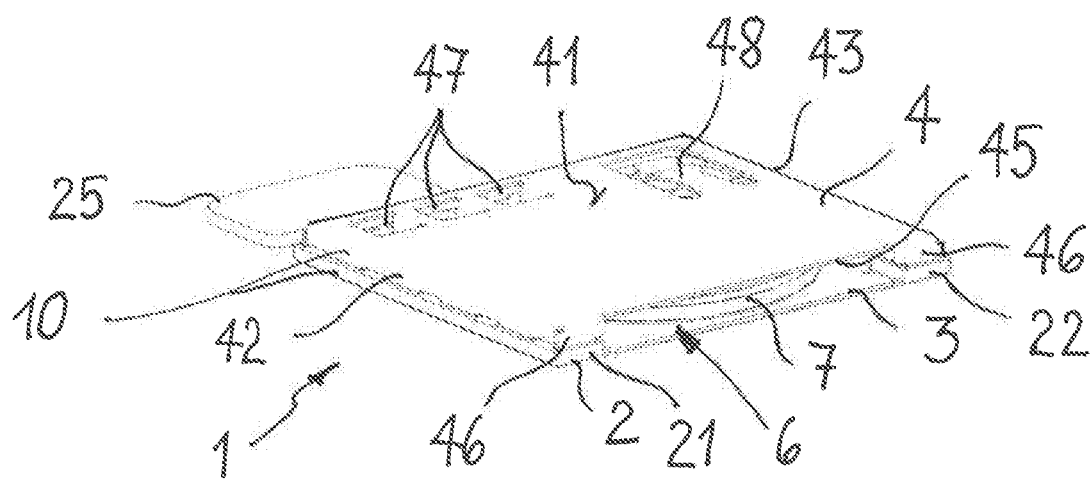
FIG. 2 is an exemplary assembled data logger according to FIG. 1 with an inserted button cell battery.

FIG. 2 shows a data logger 1 in the assembled state of the individual components 2, 3, and 4. It is clearly evident that the housing cover 4 is supported via its folded wide sides 42, 43, the folded longitudinal side, and the folded guides 46 on the second longitudinal side 45 on the printed circuit board 2 or on the flat extensions 21, 22 of the printed circuit board 2. The printed circuit board 2 with the holding part 3 that is supported in the recess and the housing cover 4 together form a housing 10 of the data logger 1. The holding part 3 that is supported in the recess in the printed circuit board 2 has an exterior surface (not shown), which extends flush into a rear side (not shown) of the printed circuit board 2 and is aligned with the latter. A slot 6 is delimited laterally by the folded guides 46 arranged on the two ends of the second longitudinal side 45, upward from the housing cover 4 and downward from the holding part 3 or the printed circuit board 2. The slot 6 makes it possible to insert a power source 7, such as a button cell battery, into the housing 10 of the data logger 1. Thereby a lower side of the power source 7 or the button cell battery comes to rest on the holding part 3 with the first electrical contacts 35 (FIG. 1). Because of the spring action of the electrical contacts 35 (FIG. 1), an opposite upper side of the power source 7 or the button cell battery comes to adjoin the inside of the housing cover 4, which forms overall a second electrical contact to the power source 7. On the rear side (not shown) of the printed circuit board 2, an adhesive layer, for example a double adhesive strip, can be arranged, with which the data logger 1 can be fastened to the object that is to be monitored or to its packaging.

FIG. 1 and FIG. 2 show that multiple windows 47 may be provided in the top surface 41 of the housing cover 4. The position of the windows 47 corresponds to the arrangement of light-emitting diodes on the printed circuit board 2. The windows 47 can be created by, for example, punching openings in the housing cover 4. It is also evident from FIG. 1 and FIG. 2 that a movable tongue 48 may be provided in the top surface 41 of the housing cover 4. The movable tongue 48 interacts with an actuating button, which is arranged on the printed circuit board 2. Depending on the embodiment of the data logger, various modi of the data logger 1, for example on/off, measurement mode, transmission mode, can be selected via the buttons.

FIG. 1 and FIG. 2 also show a knoblike extension 25 that extends from the printed circuit board 2. This extension is connected to the printed circuit board 2 via a breaking region 26 (FIG. 1). By breaking off the extension 25, the data logger 1 can be activated and/or started by the user. Breaking-off of the extension 25, for example, changes a resistance that is monitored by the data logger 1.

Figure 3:
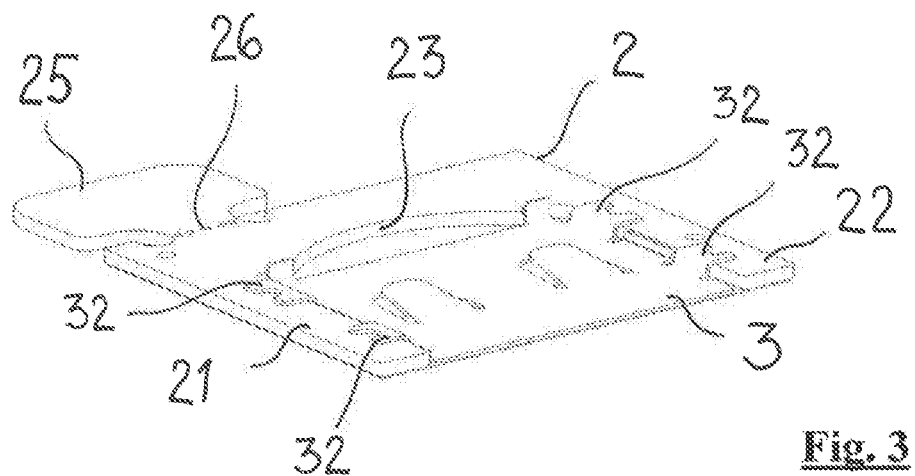
FIG. 3 is a perspective view of an exemplary printed circuit board with an inserted holding part for a button cell battery.

FIG. 3 shows a perspective depiction of the exemplary printed circuit board 2 with a holding part 3 that is supported in the recess 5. From the picture, an especially flat design is evident. For example, the holding part 3 has an exterior surface that extends flush into a rear side of the printed circuit board 2 and is aligned with the latter (not shown). It is also clearly evident that the straps 32 that are made on the holding part 3 are supported on the flat extensions 21, 22 of the printed circuit board 2. The curved face on the recess of the printed circuit board 2 is designated with reference number 23.

Figure 4:
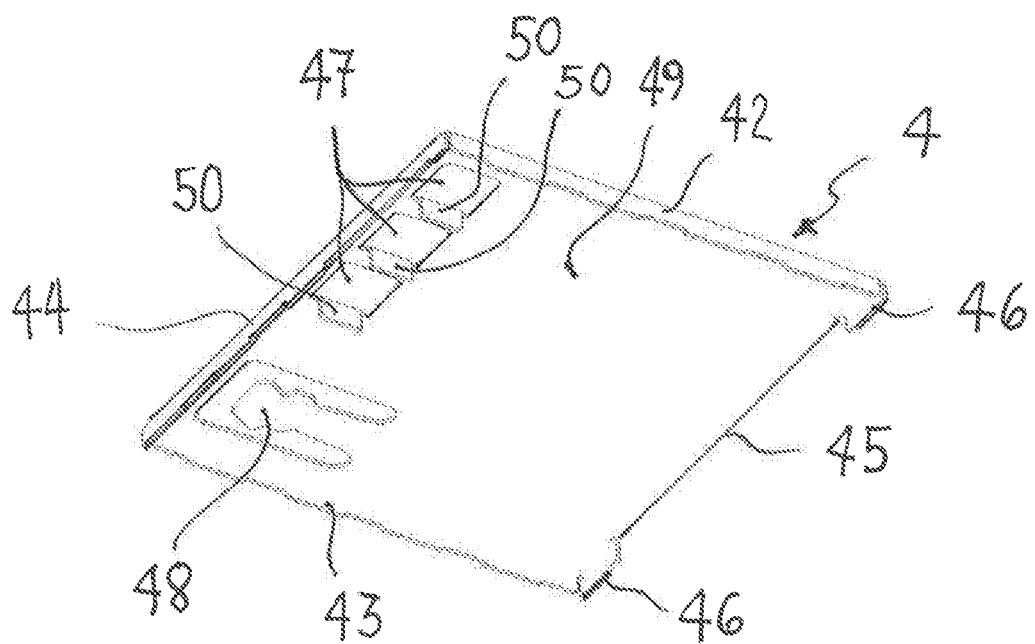
FIG. 4 is a perspective view of an exemplary housing cover with a view at its interior side.

FIG. 4 shows a perspective view of the housing cover 4 with a view at its interior surface 49. The folded wide sides 42, 43, the folded longitudinal side 44, and the two folded guides 46 on its second longitudinal side 45 are readily evident. In the area of the punched window 47, material guides 50 extend from the interior 49 of the housing cover 4. The material guides are used to support the housing cover 4 on the printed circuit board and mutually shield the light-emitting diodes that are arranged there. As a result, no radiation from adjacent light-emitting diodes can penetrate through the respective window 47.

Arranged inside the housing 10 of the data logger 1 are the various functional units for detecting, digitizing, optionally storing and optionally evaluating measurement data as well as for transmitting data. The functional units can be coupled to a central microprocessor that can be activated via the movable tongue 48 and the buttons on the printed circuit board and via which the various modi of the data logger 1 can be selected. As an alternative, the functional units can have individual microcontrollers. The activation of the respective functional unit is then also carried out via the tongue 48 and the buttons on the printed circuit board.

The light-emitting diodes on the printed circuit board can display, for example, a specifically selected functional mode of the data logger 1 through the assigned window 47. Its actual function includes (e.g., consists), however, in the visual transmission of data stored in the data logger 1 to an external, portable data processing device. The external data processing device can be, for example, a smartphone, which is equipped with a camera for recording static and dynamic patterns. As an alternative, the portable data processing device can also be a tablet computer or else a notebook computer that in each case is equipped with a camera for recording static and dynamic patterns.

For data transmission from the data logger 1 to the external data processing device, the corresponding functional unit of the data logger 1 is activated via the movable tongue 48 in the top surface 41 of the housing cover 4 and the buttons on the printed circuit board. The latter is coupled to the light-emitting diodes on the printed circuit board and transmits the data by activating the light-emitting diodes, which are controlled in time and/or intensity, in coded form.

The external data processing unit is equipped with an application that can be implemented under one or more operating systems, such as, Android, iOS, Windows Phone and Blackberry OS. The coded light pulses, recorded by the camera, of the light-emitting diodes of the data logger 1 are decoded from the application again to reproduce the transmitted data, stored and can be further processed. The results of the further processing can then be output in the form of a report, for example via a screen of the external data processing unit, for example a smartphone. As an alternative, the results can also be forwarded electronically, for example, by e-mail, in report form, for example as PDF files.

The functional unit for data transmission that is arranged inside the housing 10 of the data logger 1 can be designed and configured for a modulation of the light-emitting diodes in time and/or brightness. The modulation can be a digital phase modulation that can be implemented, for example, according to a one- or multi-dimensional Manchester Code. The Manchester Code is used in this case to transmit data and clock rates simultaneously. The signal that is generated always ensures clock flanks in order to recover both the data and the clock rate. In exemplary embodiments, the transmission of the clock rate is necessary, since the photographic detection systems on the portable data processing device are generally operated asynchronously to the clock of the light pulse supplied by the light-emitting diodes. In accordance with exemplary embodiments, the designation Manchester Code is also understood to encompass the protocol of a differential Manchester Code. A multi-dimensional Manchester Code is used when the data transmission is carried out via multiple parallel operable light-emitting diodes or similar display systems, whereby of all light-emitting diodes, always only at least one light-emitting diode changes its status from one brightness value to the next. In this case, the modulation can be carried out digitally via an activation or deactivation of the respective light-emitting diode. In another exemplary variant embodiment, the light-emitting diodes 5 can also be operated with graduated brightness levels. As a result, the transmission rate can be increased.

The invention has been explained by way of examples of a data loggers with a visual transmission of data by means of multiple light-emitting diodes. In principle, a visual data transmission can also be performed with only one light-emitting diode. The achievable transmission rate is in this case also relatively low, however. The data logger in a compact design according to the invention can be designed for a data transmission via a USB connection or else for a wireless transmission, such as, for example, via Bluetooth, ZigBee, WLAN or NFC. The preceding description is used only to explain the invention and is not to be considered as limiting. Rather, the invention is defined by the claims and the equivalents that are evident to one skilled in the art and encompass the general inventive concept.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A data logger comprising:
    a printed circuit board;
    a holding part for a power source;
    a housing cover;
    a housing, wherein the housing is provided by the printed circuit board, the holding part, and the housing cover;
    the printed circuit board having a plurality of microcontrollers for digitizing, optionally storing and optionally evaluating measurement data recorded by the data logger and for transmitting the measurement data to an external data processing device, wherein the microcontrollers are arranged on the printed circuit board inside the housing;
    the power source being arranged inside the housing and held by the holding part; and
    at least a first electrical contact for the power source which is made integrally on the holding part and has a specific spring action.

2. The data logger according to claim 1, wherein the printed circuit board comprises:
    at least one first electrical contact surface for the power source; and
    a second electrical contact for the power source formed by an interior of the housing cover that faces the printed circuit board, which housing cover can be connected with the printed circuit board.

3. The data logger according to claim 2, wherein the printed circuit board comprises:
    a recess, into which the holding part for the power source is inserted, which has an exterior surface that extends flush in a rear side of the printed circuit board and is aligned with the rear side.

4. The data logger according to claim 3, wherein the recess in the printed circuit board is configured as a flat cutaway, and the holding part connects two flat extensions of the printed circuit board resulting therefrom and is supported on the printed circuit board.

5. The data logger according to claim 4, wherein a face of the cutaway in the printed circuit board which is enclosed by the flat extensions forms a support surface for the power source, the power source being a button cell battery, and at least in places has a correspondingly curved contour.

6. The data logger according to claim 5, wherein the plurality of microcontrollers that are arranged inside the housing comprise:
    a unit for wireless data transmission.

7. The data logger according to one of claim 6, comprising:
    a movable tongue in a top surface of the housing cover, which tongue is configured for interacting with an actuating button, which is arranged on the printed circuit board.

8. The data logger according to claim 7, wherein the microcontroller for data transmission is configured for a time- and/or intensity-controlled modulation of the display system configured for emission of electromagnetic radiation.

9. The data logger according to claim 3, wherein the housing cover and the holding part are configured as punched and bended parts, respectively, of an electrically conductive metal sheet.

10. The data logger according to claim 2, wherein the plurality of microcontrollers that are arranged inside the housing comprises:
a unit for wireless data transmission.

11. The data logger according to claim 10, wherein the unit for wireless data transmission comprises:
a display system configured for emission of electromagnetic radiation, which display system is visible from outside the housing, and which is mounted on or inside the housing.

12. The data logger according to claim 11, wherein the display system configured for emission of electromagnetic radiation is configured for emission of light in a visible wavelength spectrum and/or for infrared radiation.

13. The data logger according to claim 12, wherein the display system configured for emission of electromagnetic radiation comprises:
at least one light-emitting diode, which is arranged on the printed circuit board.

14. The data logger according to claim 13, wherein a top surface of the housing cover comprises:
a window at a position that corresponds to arrangement of the at least one light-emitting diode on the printed circuit board.

15. The data logger according to claim 14, comprising multiple light-emitting diodes arranged closely beside one another and are arranged underneath the window.

16. The data logger according to claim 14, wherein the housing cover comprises:
a number of windows that corresponds to the number of light-emitting diodes on the printed circuit board, the position of the windows and the light-emitting diodes corresponding with each other.

17. The data logger according to claim 11, wherein the microcontroller for data transmission is configured for a time- and/or intensity-controlled modulation of the display system configured for emission of electromagnetic radiation.

18. The data logger according to claim 17, where the microcontroller for data transmission is configured for controlling the display system configured for emission of electromagnetic radiation by digital phase modulation according to a one- or multi-dimensional Manchester Code.

19. The data logger according to claim 18, wherein the display system configured for emission of electromagnetic radiation, which is controlled by the microcontroller for data transmission, is configured for a unidirectional communication with a smartphone, a tablet- or notebook computer, which has a camera for recording static and/or dynamic light patterns, and which is equipped with an application for decoding and further processing of the data transmitted by the display system configured for emission of electromagnetic radiation.

20. The data logger according to claim 2, comprising:
a movable tongue in a top surface of the housing cover, which tongue is configured for interacting with an actuating button, which is arranged on the printed circuit board.

* * * * *